United States Patent [19]

Kuninobu et al.

[11] Patent Number: 4,750,026
[45] Date of Patent: Jun. 7, 1988

[54] C MOS IC AND METHOD OF MAKING THE SAME

[75] Inventors: Shigeo Kuninobu, El Cerrito, Calif.; Eisuke Ichinohe, Katano, Japan

[73] Assignee: Matsushita Electric Industrial Co., Ltd., Kadoma, Japan

[21] Appl. No.: 799,556

[22] Filed: Nov. 19, 1985

Related U.S. Application Data

[63] Continuation of Ser. No. 452,402, Dec. 22, 1982, abandoned.

[30] Foreign Application Priority Data

Dec. 24, 1981 [JP] Japan .................................. 56-215229

[51] Int. Cl.$^4$ ............................................. H01L 27/02
[52] U.S. Cl. ......................................... 357/42; 357/41; 357/45; 357/71
[58] Field of Search ................... 357/45 M, 40, 42, 45, 357/59, 68, 41, 71

[56] References Cited

U.S. PATENT DOCUMENTS 4,053,336 10/1977 Grundy et al. ..................... 357/40
4,412,237 10/1983 Matsumura et al. ............. 357/45 X
4,481,524 11/1984 Tsujide .................................. 357/51
4,549,198 10/1985 Kondo .................................. 357/42

FOREIGN PATENT DOCUMENTS 2823555 12/1978 Fed. Rep. of Germany ... 357/45 M

Primary Examiner—Andrew J. James
Assistant Examiner—Sara W. Crane
Attorney, Agent, or Firm—Cushman, Darby & Cushman

[57] ABSTRACT

In a C MOS IC as shown in FIG. 7(A) and FIG. 8, the IC comprises vertical row of horizontally long blocks, each block comprising p-type MOS transistor region and n-type MOS transistor region, the IC comprises horizontal wirings of aluminum (31, 32, 33) and vertical wirings of polycrystalline silicon (61, 62, 63, 64, 65, 41, 42), with insulation films on the upper side and on the lower side of the polycrystalline silicon film, between the rows (I, II, . . .), said horizontal aluminum wirings (31, 32, 33) and said polycrystalline silicon wiring (61, 62 . . ., 41, 42) being appropriately connected through openings (105, 105 . . .) formed in said insulation film inbetween, said vertical polycrystalline silicon wirings being connected through aluminum wirings in said blocks.

8 Claims, 9 Drawing Sheets

C MOS IC AND METHOD OF MAKING THE SAME

This is a continuation of application Ser. No. 452,402, filed Dec. 22, 1982, which was abandoned upon the filing hereof.

BACKGROUND OF THE INVENTION

Field of the Invention

The present invention relates to a C MOS IC with novel interconnection means between circuit blocks and cells.

As integrated circuits continue to increase in complexity, several design techniques have been proposed to improve circuit performance and maintain an acceptable design time. These are discussed hereafter.

FIG. 1A shows a pattern of an example of the conventional C MOS (complementary MOS) cell, and FIG. 1B shows an equivalent circuit of the C MOS cell of FIG. 1A and FIG. 1C is a detailed circuit connection diagram of the C MOS circuit. In FIG. 1A, the upper part p1 designates a p-channel transistor region and a lower part n1 designates an n-channel transistor region. A square region 1 encircled by a chain line is a unit cell. In FIG. 1A, numeral 2 designates aluminum wirings which are of an uppermost part, and which are mainly disposed in a first direction on a chip, which is vertical in FIG. 1. Numeral 3 designates wiring conductors formed with polycrystalline silicon or gate regions formed with the polycrystalline silicon films which are insulated from an underlying substrate with a lower insulation film, and insulated from the overlying aluminum wirings with an upper insulation film. Numerals 4, 6 and 7 designate impurity diffused regions which are source regions and drain regions. Numeral 5 designates interconnection parts between the aluminum wirings 2 and the underlying polycrystalline silicon conductors 3 which make connections through openings formed in the upper or lower insulation film and are schematically shown by a square with a cross therein. Fine dot marks on the aluminum wiring regions and broken line hatchings on the diffused regions are drawn for easier understanding of the configuration. The diffused regions 6, 6 of the p-channel transistor regions p1 and diffused regions 7,7 of the n-channel regions n1 are connected to power source potential and grounding potential, respectively.

The circuit of FIG. 1A forms, as shown in FIG. 1B, a four-input AND-OR composite gate circuit, which has a detailed circuit construction comprising four p-channel MOS transistors in the p-type regions p1 and four n-channel MOS transistors in the n-type regions n1, respectively, as shown in FIG. 1C. That is, as shown in FIG. 1A, the IC has p-channel MOS transistors in the upper p1 region and n-channel MOS transistors in the lower n1 region.

In such a conventional silicon gate MOS IC, since the diffused source regions and the diffused drain regions are formed by means of a self aligning process at both sides of each polycrystalline silicon gate electrode region, it is impossible to form lead-pit wiring made of polycrystalline silicon of the part other than the gate electrode parts in a manner to cross the diffused regions. That is, as shown in FIG. 1A, it is impossible to form conductors of polycrystalline silicon in the vertical direction of FIG. 1A between the regions p1 and n1, so as to cross the diffused regions 6 and 7 which are power source potential and ground potential lines respectively.

If the polycrystalline silicon conductor is intended to be formed to cross the diffused regions, then the diffused region such as 6 or 7 is cut off under the part of the polycrystalline conductor, since the forming of the diffused region is made after forming the polycrystalline region. The present art of producing silicon gate MOS IC wiring is to form polycrystalline conductors on a semiconductor substrate with an insulation film inbetween and on the polycrystalline silicon conductors further aluminum wirings are formed with a second insulation film inbetween. Accordingly, the aluminum wiring can cross over the diffused region and the polycrystalline conductors. Accordingly, in the configuration of FIG. 1A wherein aluminum wirings A, B, C, D and O to connect function elements inside the cell are formed vertically as shown in FIG. 1A, it is impossible to form aluminum wirings so as to run horizontally of FIG. 1A between the cells in a p-type region or n-type region in line in the horizontal direction of FIG. 1A, since there are already vertical aluminum wirings between the horizontally neighboring cells. Accordingly, in the device of FIG. 1A, polycrystalline silicon must be used as wiring to lead out in a horizontal direction from the cells.

FIG. 2 shows a schematic view of an IC which is formed by combining a plural number of logic cells in a horizontal direction and in a vertical direction in accordance with a known building block construction. In FIG. 2 the blocks $L_1, L_2 \ldots L_n, L_m, L_{m+1} \ldots L_{m+n}$ show circuit construction and spatial construction of logic cells each composed as shown in FIG. 1A to FIG. 1B, and a plural number of cells in a horizontal direction $L_1, L_2 \ldots L_n$ form a logic circuit block I. Another plural number of cells $L_m, L_{m+1} \ldots L_{m+n}$ form a next logic circuit block II. For instance, in a microcomputer or the like, a data bus line has a number of connections in a logic circuit block and control lines between the logic circuit blocks are formed to cross the bus line. As shown in the foregoing elucidation, in each logic circuit block, p-type MOS transistor region such as p1 and n-type MOS transistor region such as n1 are interconnected by aluminum wires $l_{A1}$, and electrical interconnection of the logic circuit blocks I, II . . . are made by aluminum wirings $l_{A2}$, to which polycrystalline silicon conductor wirings $l_{S1}, l_{S2} \ldots$ are connected in a horizontal direction. For instance, an electrode in a cell $L_1$ is led out horizontally by the polycrystalline silicon conductor wiring $l_{S1}$ to the vertical aluminum wiring $l_{A2}$, and an electrode in a cell $L_{m+1}$ is led out by a horizontal polycrystalline silicon conductor wiring $l_{S2}$ to the vertical aluminum wiring $l_{A2}$ and the electrodes of the cells $L_1$ and $L_{m+1}$ are connected through the polycrystalline silicon conductors $l_{S1}$, aluminum wiring $l_{A2}$ and polycrystalline silicon wiring $l_{S2}$. Mark $l_{S3}$ in FIG. 2 shows a polycrystalline silicon conductor wiring and $l_{A3}$ is another vertical aluminum wiring. Substantially vertical lines $l_{AC}$ show control lines which are aluminum wirings connecting the vertically disposed logic circuit cells.

As shown in FIG. 2, the conventional device uses aluminum vertical wirings and polycrystalline silicon horizontal wirings. Due to the considerable resistance of the long polycrystalline silicon wiring, the signal propagation time is not negligible and high speed operation cannot be expected. That is, in an actual logic IC of a microprocessor or the like for instance, the horizontal bus lines $l_{S1}, l_{S2}, l_{S3}$ of polycrystalline silicon wirings become several tens μm to 1 mm in total. When a high speed operation at several MHz or higher frequency is necessary, the high speed operation of the logic circuit becomes impossible.

Hitherto, when the integration scale of the IC is not so large, there has been no need of integrating the complementary circuit cells in vertical rows and in horizontal lines. In such conventional case of a relatively small IC, guard bands to surround periphery regions of the p-type MOS transistor region or n-type MOS transistor region are formed by means of an impurity diffusion process. When there is no particular need in stacking a plural number of logic circuit cells in the vertical direction, no particular problem takes place with cells like FIG. 1A.

However, in a large scale integrated circuit such as random logic represented by a microcomputer, there is a necessity of integrating a certain number of logic circuit blocks in 8 stages or 16 stages or the like of many stages, which must be mutually connected, and the above-mentioned problem arises.

FIG. 3 shows a detailed construction of the circuit configuration of the FIG. 2 circuit. Therein, in the logic circuit blocks I, II . . . , the n-type MOS transistor region n1 and an n-type MOS transistor region n2 are disposed in neighboring relationship and connection between the blocks I and II is made by aluminum wirings $l_{42}$, and other aluminum wirings $l_{43}$ and $l_{44}$ are connected to suitable diffused regions 6 and 7. As above-mentioned, when a very complicated logic circuit block construction is constituted by utilizing the configuration of the cell of FIG. 1, then it is necessary that the bus lines $l_{S1}$, $l_{S2}$, $l_{S3}$ must be horizontally led out by polycrystalline silicon conductor wirings, and due to its poor signal transmission characteristic, a high speed operation is impossible. Even if aluminum wirings such as $l_{42}$ is used as a part of a bus line as shown in FIG. 2 and FIG. 3, as the distance of leading of the polycrystalline silicon conductor wirings $l_{S1}$, $l_{S2}$ becomes long, the advantage of using the aluminum wirings are not fully effected and high frequency operation is difficult. Generally, the aluminum wiring has a specific resistivity of about 20 mΩ/□, while that of the polycrystalline silicon wirings is more than 10 Ω/□ even when a high concentration impurity is doped, the conductivity of aluminum wirings is about several hundred times larger than that of the polycrystalline silicon wirings. This means that the signal transmission speed of the former is faster by several times than the latter.

FIG. 4 shows another example of a conventional logic circuit cell for increasing signal transmission speed by using aluminum wirings in a horizontal direction, taking account of the above-mentioned situation. In FIG. 4, the corresponding part to those of the above-mentioned conventional example shown in FIG. 1 through FIG. 3, are designated by the corresponding numerals and elucidations of them are omitted for simplicity. And power source potential and ground potential are given by aluminum wirings 6A and 7A to respective diffused regions.

FIG. 5 shows a configuration of an IC wherein a number of cells shown in FIG. 4 are used. In FIG. 4, cell $L_{1m}$, $L_{2m}$, $L_{3m}$ . . . together form a first logic block I and cell $L_{3m+1}$, $L_{3m+2}$ . . . form a second logic circuit block II. In the configuration of FIG. 4, the problem of the conventional example of FIG. 1 through FIG. 3 is improved, that is, signal propagation delay is improved by disposing the aluminum wirings for instance, shown in FIG. 5 as $l_{411}$, $l_{412}$, $l_{413}$ . . . in a horizontal direction; but in this case, vertical wiring of the aluminum wiring is not possible. In this configuration of FIG. 5, since no diffused regions to define the power source potential and ground potential are formed in the p-channel MOS transistor region and n-channel MOS transistor region, vertical connections inside the cells and towards outside the cells can be made by vertical polycrystalline silicon wirings $l_{S11}$, $l_{S12}$, $l_{S13}$, $l_{S14}$, . . . As abovementioned, the configuration shown by FIG. 4 and FIG. 5 enables forming interblock vertical connections by means of polycrystalline silicon wirings and intercell horizontal connections by means of horizontal aluminum wirings. Accordingly, the conventional problem of the configuration of FIG. 1 through FIG. 3 of difference in signal propagation speed is alleviated.

However, the configuration of FIG. 4 and FIG. 5 has the following two problems.

(1) Since the vertical wirings are formed with polycrystalline silicon wirings $l_{S11}$, $l_{S12}$, $l_{S13}$ and $l_{S14}$, when the number of vertical rows of the logic circuit blocks I, II, . . . increases, the polycrystalline silicon wiring in total becomes long, and delay of the signal propagation thereon can not be neglected. For instance, when the logic circuit blocks . . . I, II . . . becomes 8 stages, then the length of the polycrystalline silicon wirings becomes more than 1 mm and the signal propagation becomes very slow, damaging satisfactory operation.

(2) Because of existence of the polycrystalline silicon wirings in the vertical direction, horizontally extending diffused regions to define the power source potential and ground potential cannot be made thereunder. Accordingly, it is not possible to form guard band regions around a p-well region formed in the n-type semiconductor substrate, therefore it is likely to produce latching-up.

SUMMARY OF THE INVENTION

Accordingly, the present invention intends to provide an IC of a building blocks configuration. The IC in accordance with the present invention achieves stable operation (that is operation with less latching-up in case of C MOS IC) and high speed operation by constructing the power source potential lines, grounding potential lines and interconnecting wirings in a manner that a large scale circuit can be made easily.

Outstanding features of the C MOS IC in accordance with the present invention are as follows: In a cell of the IC, providing aluminum wiring to be impressed with a power source potential or ground potential in a direction with a right angle to the aluminum wiring interconnecting the p-type MOS transistor region and the n-type MOS transistor region. The C MOS IC comprises polycrystalline silicon conductor wirings which cross under said aluminum wirings of power source potential and grounding potential insulated from the aluminum wirings, said polycrystalline silicon wirings being disposed so as to have fairly small resistivity in total. Bus lines or signal lines can be formed with aluminum wiring in parallel with the power source potential line and ground potential line, thereby achieving high speed response of LSI circuit. Guard bands can be formed between p-type MOS transistor regions and n-type MOS transistor regions whereby stable circuit operation is achievable, that is latching up operation is alleviated in case of C MOS IC.

DESCRIPTION OF THE PREFERRED EMBODIMENT

Figure 1A:
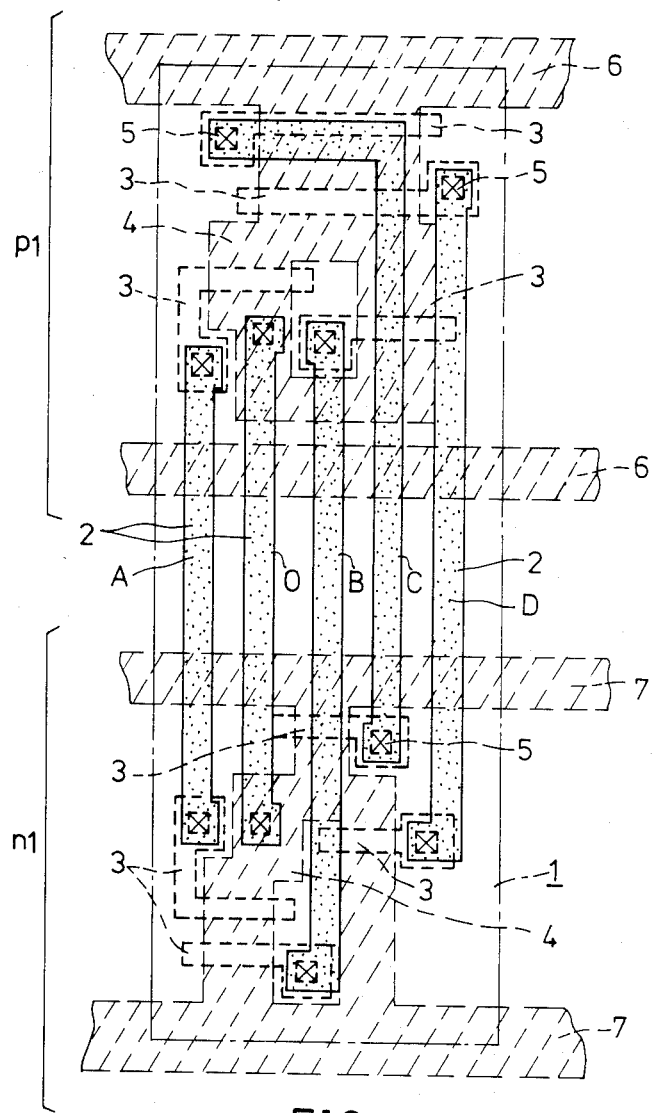
FIG. 1A is the plan view pattern of the conventional circuit.

A complementary MOS IC in accordance with the present invention comprises on a single semiconductor substrate:

a plural number of logic circuit blocks (I, II, . . . ) shaped oblong in a first direction (horizontal), and disposed in a row in a second (vertical) direction, each said logic circuit block (I, II, . . . ) comprising an n-type MOS complementary element region (n1 or N2 or . . . ) oblong in said first direction and a p-type MOS pn complementary element region (p1 or p2 or . . . ) oblong in said first direction, each said n-type MOS pn complementary element region and said p-type MOS pn complementary element region comprising a plural number of logic cells (1, 2 . . . ) disposed in a line in said first direction, each said logic cell comprising a plural number of semiconductor elements, and a plural number of metal wirings (A, B, C, D) extending at least in said second direction for interconnection between said semiconductor elements, a plural number of diffused regions to serve as electric wirings for power source potential and ground potential and disposed in said first direction, a plural number of a first kind wirings (metal wirings 31, 32, 33) of a very high conductivity disposed extending horizontally in a space between a neighboring two of said logic circuit blocks (I and II, II and III, etc.)

a plural number of a second kind wirings (polycrystalline silicon wirings 29, 30, 40, 41, 49, 62) of a lower conductivity than that of said first kind wirings disposed in said second direction (vertical) crossing under said first kind wirings in insulated manner from said semiconductor substrate (100) and said first kind wirings, and further wirings (26, 27, 28) of said second kind (polycrystalline silicon) led out in said second (horizontal) direction from said logic cell (1, 2 . . . ).

A preferred embodiment in accordance with the present invention is elucidated in reference to FIG. 6, FIG. 7A, FIG. 7B and FIG. 8.

Figure 6:
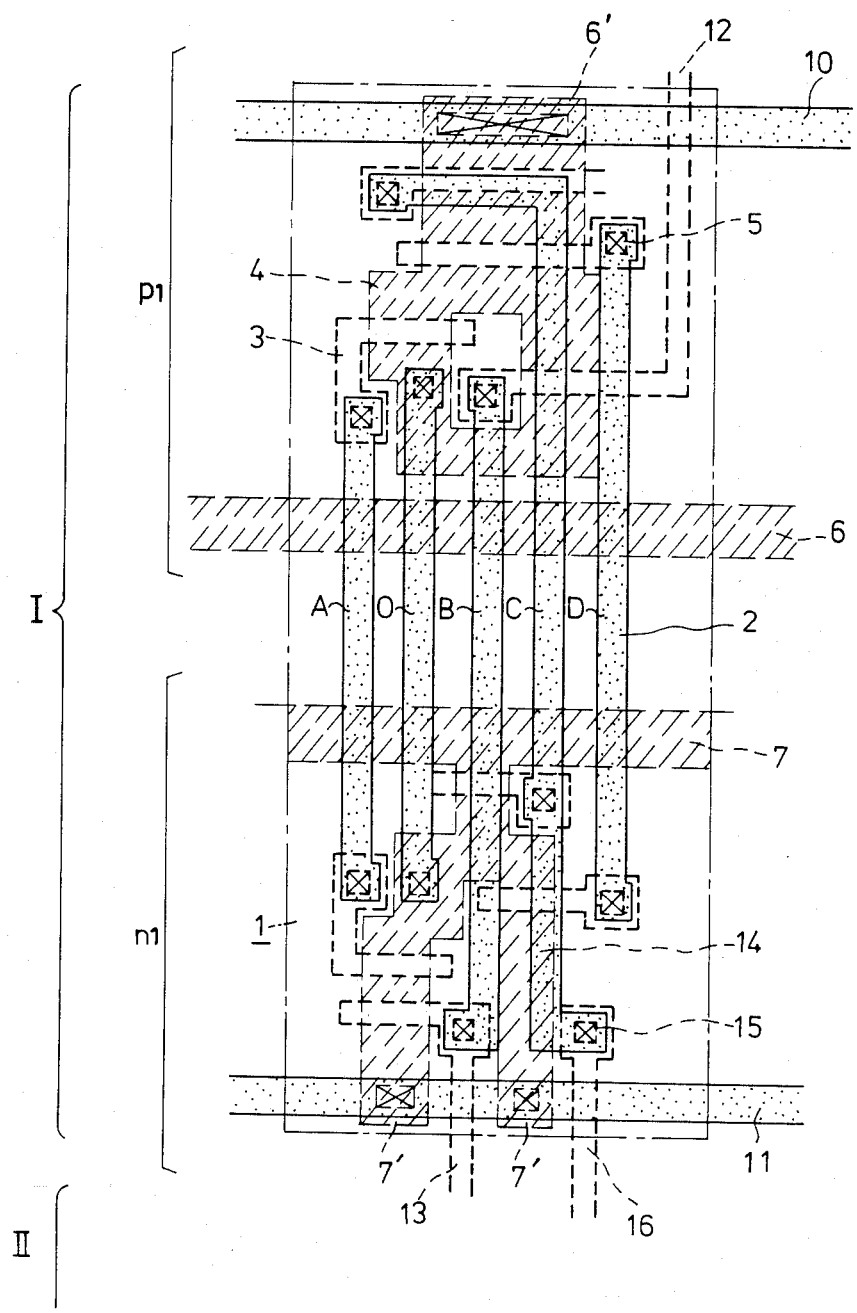
FIG. 6 is a plan view pattern of a logic circuit cell embodying the present invention.

FIG. 6 shows a plan view pattern configuration of logic circuit cell of an example in accordance with the present invention. The logic circuit device of FIG. 6 has the same circuit constitution as that of FIG. 1 and the corresponding parts and components are designated by the same numerals, and redundant explanation therefor is omitted.

Figure 1B:
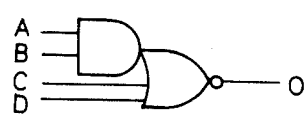
FIG. 1B is a circuit block diagram of the IC of FIG. 1A.
Figure 1C:
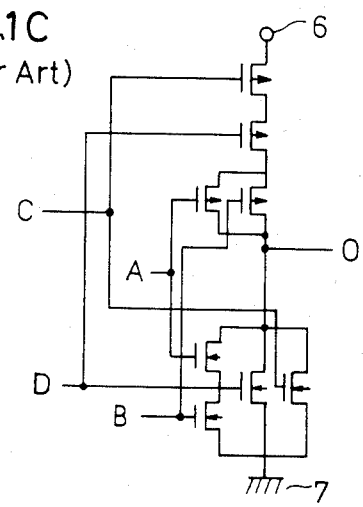
FIG. 1C is the detailed circuit diagram of the IC of FIG. 1A.

In FIG. 6, numerals 10 and 11 designate aluminum wirings for power source potential and ground potential, respectively, and main aluminum wirings within a cell are disposed in vertical direction similar to the case of FIG. 1. The aluminum wirings of power source potential 10 and of grounding potential 11 may or may not have a contact point within cells. Diffused regions disposed on both outermost parts of each cell are, unlike the case of FIG. 1, disposed only partly of the width of the cell as designated by numerals 6' and 7', and from these regions electric connections can be and are made to the overriding polycrystalline silicon wirings, which are led upwards and downwards of FIG. 6. For instance, input wiring of the aluminum line B is led out by means of polycrystalline silicon wirings 12 and 13 upwards and downwards. And, for a method of forming wirings toward the outside of cell 1 as shown for the case of connection with the aluminum wiring 14, the aluminum wirings can be led out by the polycrystalline silicon wiring 16 connected at a connecting part 15.

In the cell configuration shown in FIG. 6, vertical wirings within the cell can be made by aluminum wiring insulated by an insulation film from the semiconductor substrate, and also upward and downward leading out from the cell 1 is made by a polycrystalline silicon wiring 16 or 12 which are formed insulatedly between a lower insulation film and an upper insulation film to insulate from the substrate and from the aluminum wirings, respectively. Furthermore, this configuration can realize that horizontal aluminum wirings can be made between logic circuit blocks I, II . . . and connections between these horizontal aluminum wirings and the vertical polycrystalline silicon wirings 13, 16 and 12 can be made freely.

Figure 7A:
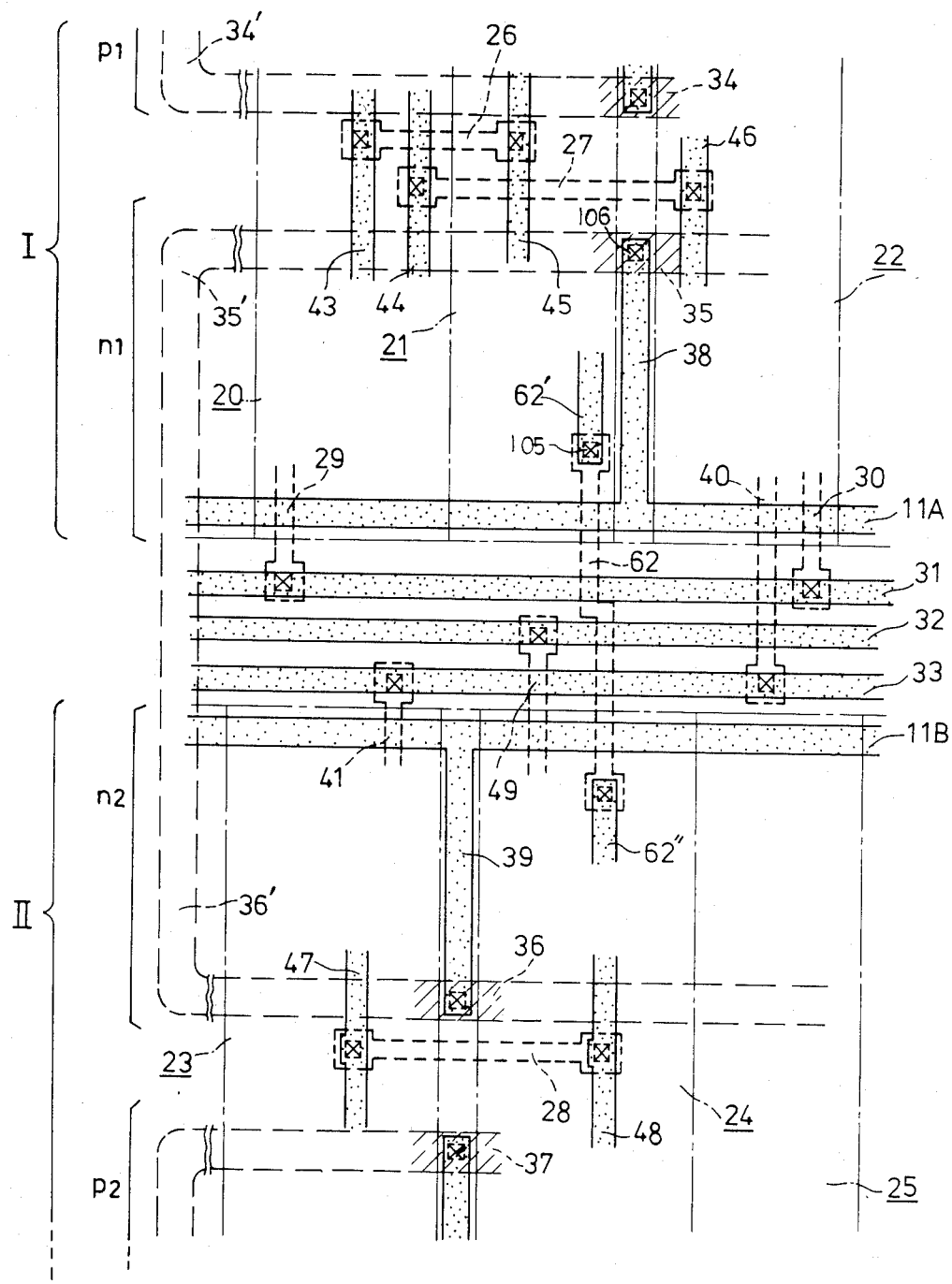
FIG. 7A is a plan view of a part of a logic circuit employing the cell of FIG. 6.
Figure 7B:
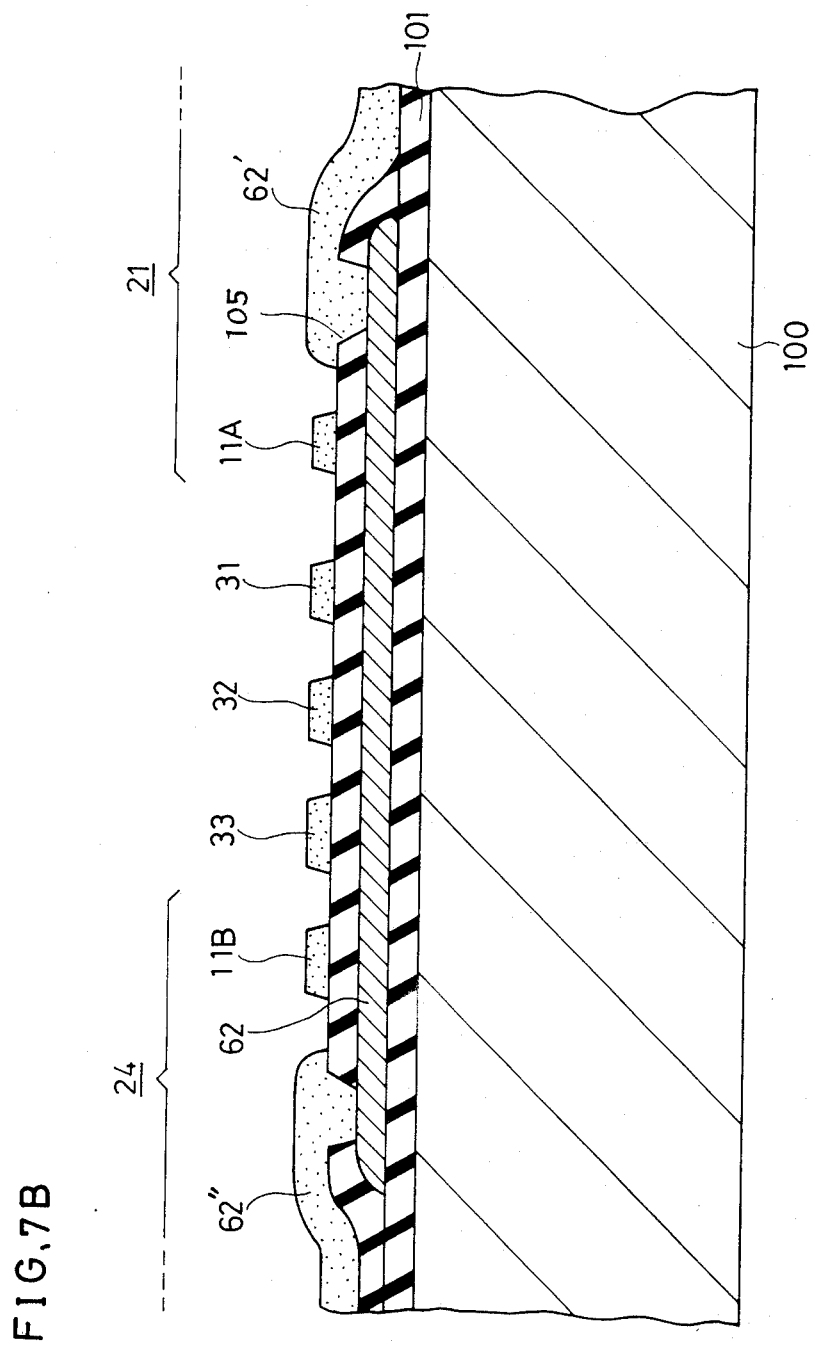
FIG. 7B is a sectional view of the logic circuit device of FIG. 7A taken along the center of polycrystalline silicon wiring 62 of FIG. 7A.

FIG. 7A shows logic circuit blocks formed on a semiconductor substrate by utilizing the logic circuit cells of FIG. 6, and FIG. 7B shows a sectional structure of a part of the IC of FIG. 7A cut at the center of the polycrystalline silicon wirings 62. In FIG. 7A the logic circuit cells 20, 21, 22 . . . constitute a logic circuit block I, and logic circuit cells 23, 24, 25 . . . constitute a next logic circuit block II. And the logic circuit blocks I and II are formed adjoining with n-type MOS transistor regions n1 and n2 to adjoin each other; and further to the next logic circuit block III, the adjoining regions are p-type MOS transistor part p2 and a p-type MOS transistor part (not shown) of the next block III. And accordingly, grounding windings 11A, 11B are formed closely to the logic circuit blocks I and II, respectively. In the same manner, between the logic circuit blocks II and III the power source windings (not shown) are formed close to the p2 region and p3 region (not shown), respectively.

In the device of FIG. 7A, connections between the cells can be made by means of polycrystalline silicon wirings 26, 27 and 28 between the p-type MOS transistor region p1 and ntype MOS transistor region n1, but alternatively may be made by means of aluminum windings 31 and polycrystalline windings 29, 30 and 31 connected thereto. Aluminum horizontal wirings 32 and 33 are used as signal propagation bus lines for mutual connection, etc. Incidentally, when a signal propagation line is relatively short such as for mutual connection between cells of the same logic circuit block I, then the mutual connection between the cells are preferably made by means of the polycrystalline silicon wirings 26 and 27; and for the relatively long distance connections like the bus line, hybrid connections of leading out from the cells by means of short polycrystalline silicon wirings 29 and 30, and relaying the connection by a long distance aluminum wiring 31 connected thereto, thus the overall propagation delay can be made small. The horizontal aluminum line 32 is a bus line which is to be connected to a region which is not shown. By utilizing this configuration by preliminarily determining the number of polycrystalline silicon windings (26, 27) between the p-type region p1 and n-type region n1, and by preliminarily deciding the gap between the p-type region and n-type region, then only one cell standardized for the same logic cell can be used, thereby the number of cells can be decreased compared with the conventional configuration.

For the diffused regions 34, 35, 36 and 37, to which power source potential or grounding potential must be impressed, the leading is made from the ground lines 11A and 11B into the cell through the aluminum wirings 38 and 39 and they are interconnected with each other. In this configuration the grounding line and the power source line can be individually connected to respective logic circuit blocks I, II . . . , accordingly, configuration of the logic circuit block is easy.

Next, elucidation is made on the mutual connection between logic circuit blocks I, II . . . disposed in vertical rows. This is for instance, a microcomputer wherein internal resistor control, controlling of input and output to data bus or the like control lines are included, and this can be used for other relatively short distance interconnection. For instance, polycrystalline silicon wiring 40 from the cell 22 in the logic circuit block I and polycrystalline silicon wiring 41 from the cell 23 in the logic circuit block II are interconnected by aluminum wiring 33. In this case even though the cell 22 and the cell 23 are each other considerably apart, only the aluminum wiring 33 becomes relatively long, and this does not make substantial effect on the signal propagation delay and a short propagation time is obtainable. And as shown in FIG. 7A, since there is no horizontally oblong diffused regions in the blocks I and II as a whole, a vertical polycrystalline silicon wiring 62 between the neighboring blocks I and II can be used. That is, by utilizing a vertical silicon wiring 62 which insulatedly crosses the aluminum wirings 31, 32 and 33, for instance interconnection of the cell 21 and cell 24 can be made. And a vertical wirings within cell 43, 44, 45, 46, 47 and 48 can be formed by aluminum wirings. And numeral 29, 30, 40, 41 and 49 show polycrystalline silicon wirings. Thus, even when the logic circuit blocks I, II . . . are integrated in the vertical row, the wiring within the cell can be made by aluminum and only the interblock connection is made by polycrystalline silicon wirings. That is to say, use of the polycrystalline silicon wirings is mainly for the interblock connections which is relatively short, and therefore, even when the vertical connection wirings become long, their total resistances are not so large and therefore, vertical signal propagation delay is not large, contrasted to the conventional configuration of FIG. 4 where the vertical wirings are all made by the polycrystalline silicon and signal propagation delay due to the high resistivity of the vertical polycrystalline silicon wirings are a problem.

The connections between the polycrystalline silicon wirings and the underlying diffused regions as wirings are made through openings (106) formed in the lower insulation films which is formed between the semiconductor substrate and the polycrystalline wirings; and the connection between the polycrystalline silicon wirings and the overlying aluminum wirings are made through openings 105 formed in the upper insulation films which is formed between the polycrystalline wirings and said aluminum wirings.

In the complementary type MOS integrated circuit, ordinarily p well regions are formed in the n-type silicon substrate and, in that p-well region a predetermined number of n-channel transistors are formed. In such configuration, in order to prevent latch up phenomena, it is preferable to form a guard band diffused region around the p well region. Thereupon, as shown in FIG. 7A the blocks I and II are so formed that n-channel MOS transistor regions n1 and n2 are disposed to be close to each other, and these two n-channel regions n1 and n2 can be formed in a common p-type well and a common guard band 35-35'-36'-36 can be formed to enclose these n-type regions n1 and n2 all together. That is, by forming the diffused regions 35 and 36 as guard band regions, thereby latch up can be easily avoided, and stable operation is achievable.

Figure 8:
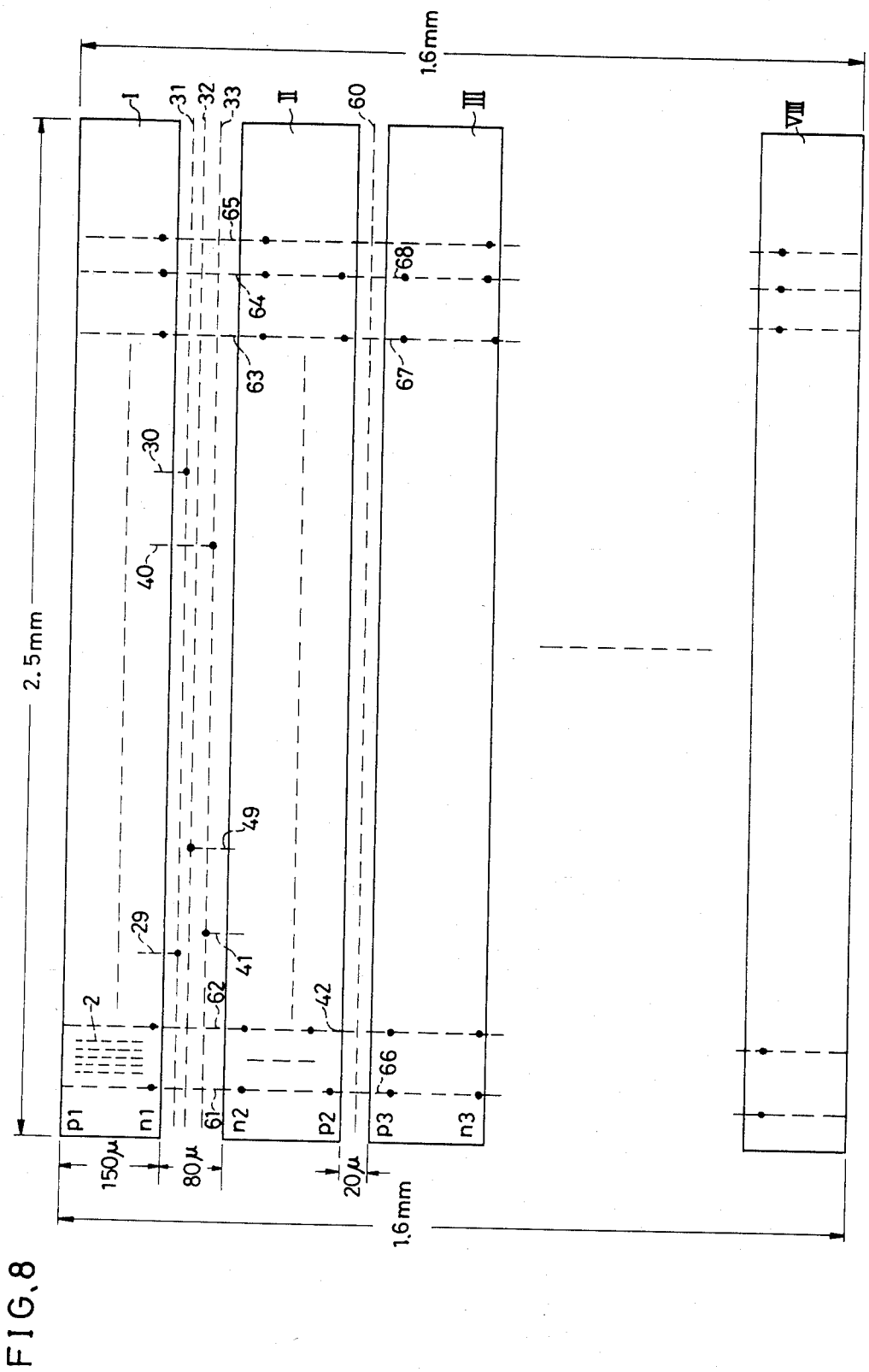
FIG. 8 is a plan view of the logic circuit device constituted employing the logic circuit cells of FIG. 6.

In summarizing the above, the advantage and disadvantage of the conventional examples of FIG. 1 through FIG. 5 and present invention example of FIG. 6 to FIG. 8 are comparatively shown in the following Table 1.

TABLE 1

Figure 2:
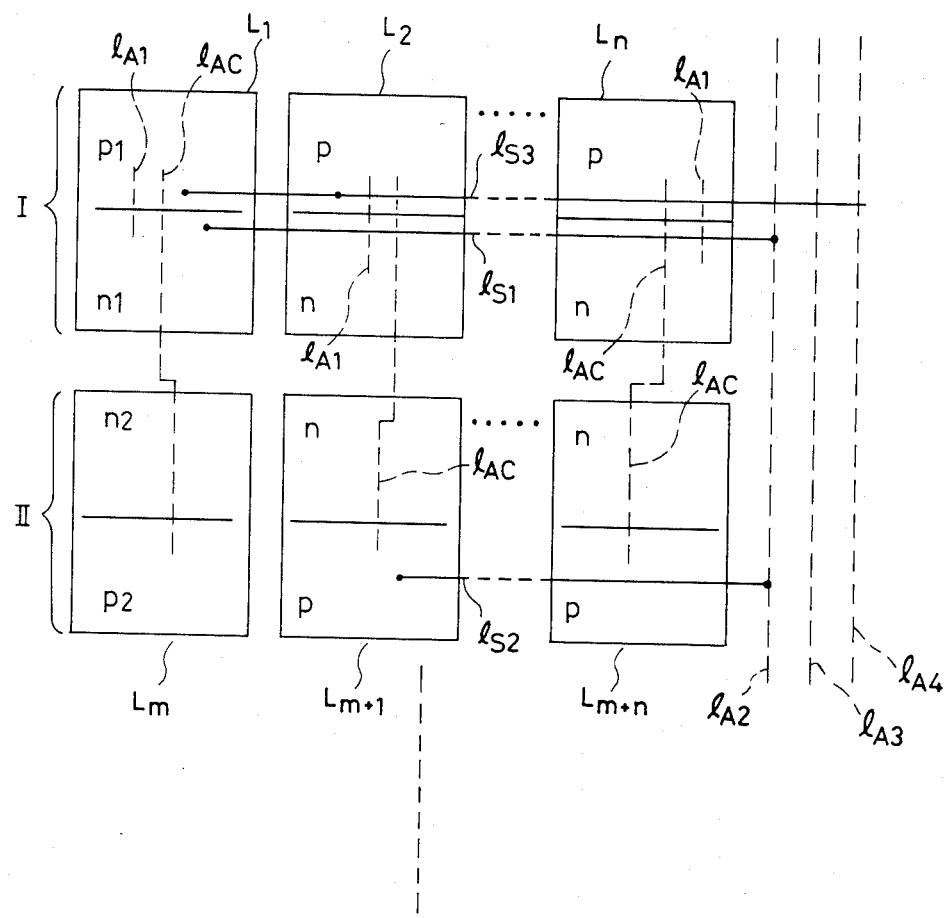
FIG. 2 is the schematic block diagram of the logic circuit block utilizing the configuration of FIG. 1A.
Figure 3:
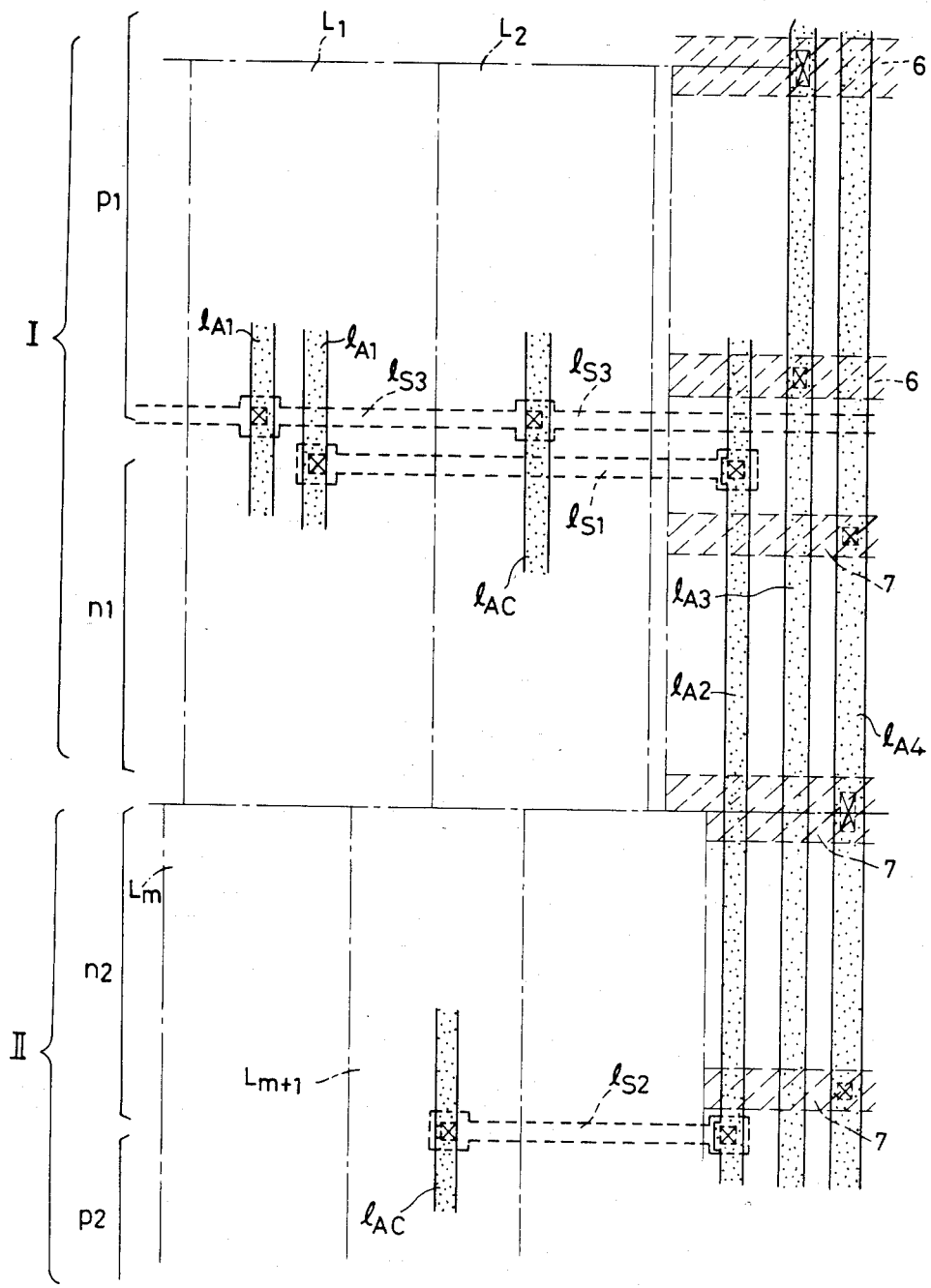
FIG. 3 is the plan view showing more detailed configuration pattern of the device of FIG. 2.
Figure 4:
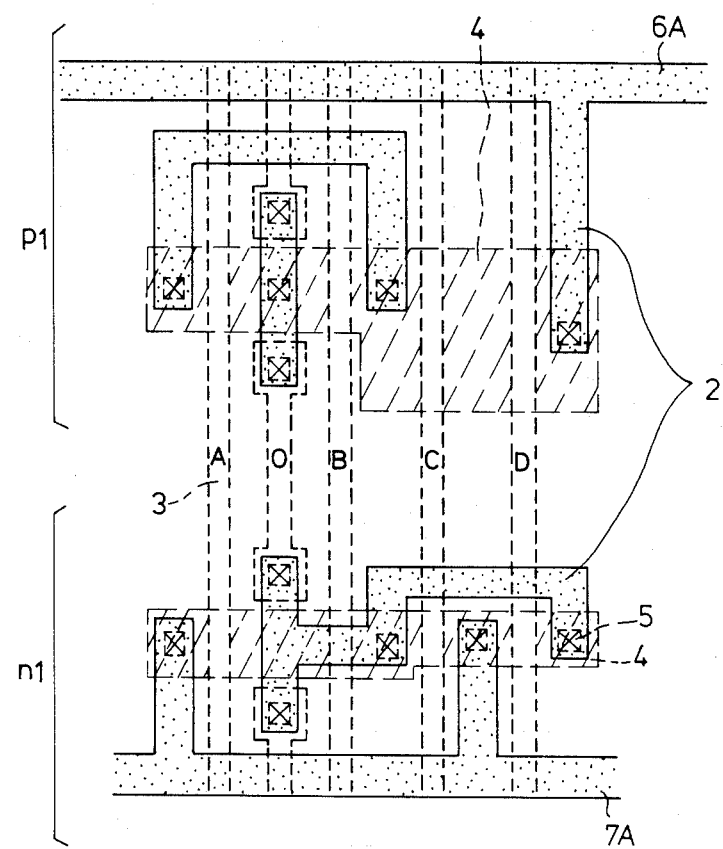
FIG. 4 is the plan view pattern of the other conventional example.
Figure 5:
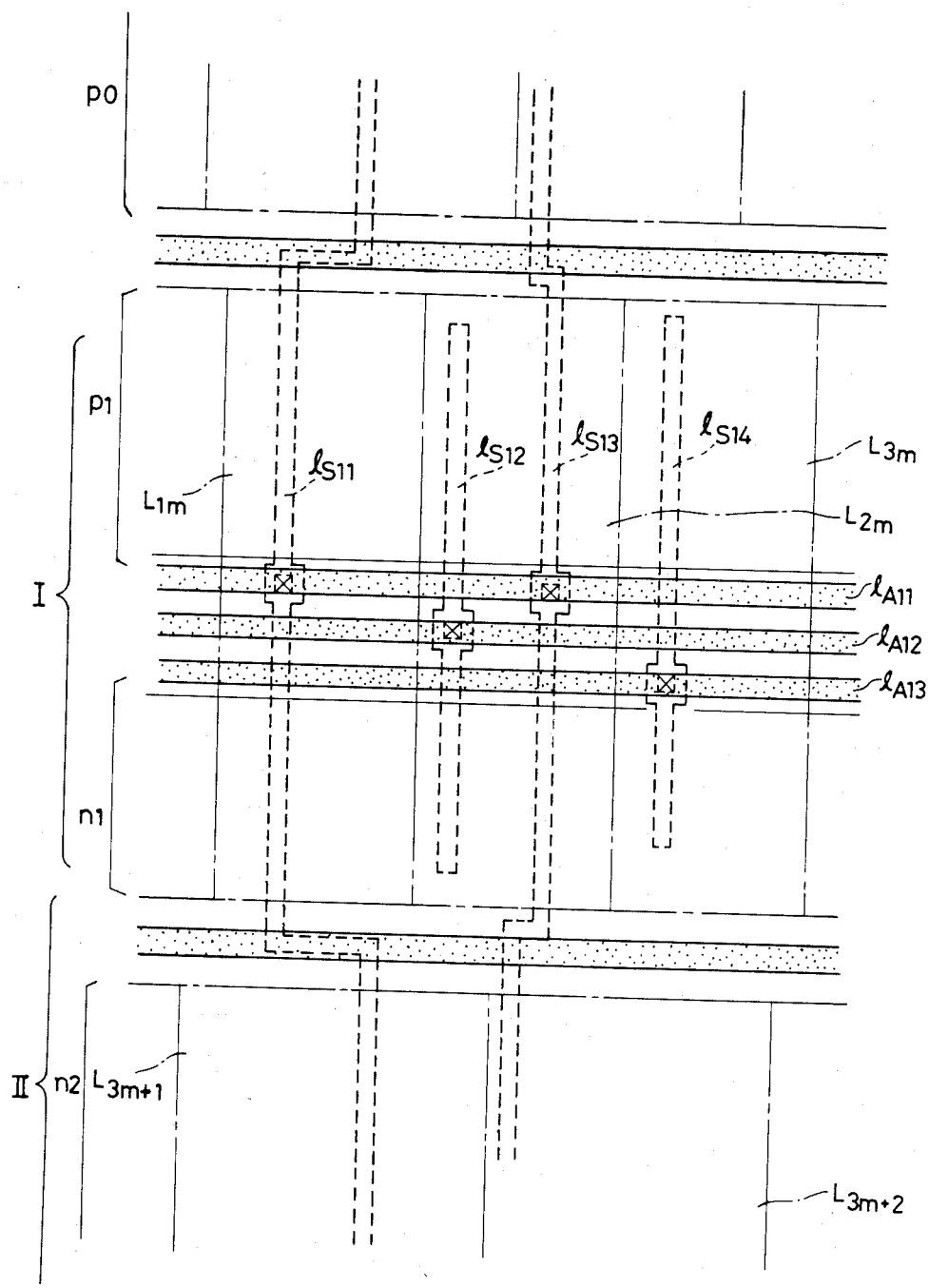
FIG. 5 is the detailed plan view of the configuration of one part of the conventional example of FIG. 4.

| | | Prior art of FIG. 1 to FIG. 3 | Prior art of FIG. 4 & FIG. 5 | Present invention embodiment of FIG. 6 to FIG. 8 |
|---|---|---|---|---|
| Signal propagation delay | Vertical direction | large | large | medium |
| | Horizontal direction | large | small | small |
| Elimination of latch up | | good | poor | good |

As can be observed from the table, in the prior art of FIG. 1 to FIG. 3 a relatively long vertical polycrystalline silicon wirings is used and accordingly there is undesirable signal propagation delay. In the prior art of FIG. 4 and FIG. 5, vertical direction wirings consisting of all polycrystalline silicon wiring are problematic. On the contrary, in the present invention example of FIG. 6 to FIG. 8, the polycrystalline silicon wirings may be used only for a very short part in the vertical direction, and therefore, a quick signal propagation can be made both in the vertical and horizontal direction.

In a large scale integration such as microcomputer or the like, in the processing unit part, for instance, for an 8-bit LSI, it comprises eight logic circuit blocks stacked in vertical rows and connections must be made vertically between the logic circuit blocks and horizontally between the cells of the blocks. In such large scale integration, the effect of high resistance of the polycrystalline silicon wirings is a big problem to be solved and the present invention can solve this problem. FIG. 8 shows a construction of a one chip microcomputer wherein in the logic processing part and resistor part the configuration of FIGS. 6, 7 and 8 is utilized. In this configuration, the microcomputer has an 8-bit configuration and therefore it comprises eight stage logic circuit blocks I, II ... VIII. And the part shown in FIG. 8 occupies about one third of the area of a semiconductor chip, and the vertical length of the part of FIG. 8 is 1.6 mm and horizontal length for the width is 2.5 mm. Numerals 31, 32 and 33 designate aluminum wirings such as bus line, etc. disposed between the n1 region and n2 region of the block I and II, respectively. Numeral 60 designates an aluminum wiring between the region p2 and p3 of the blocks II and III, and the aluminum wiring is used, for instance, as a bus line. In accordance with the present invention, even though the horizontal wirings of aluminum are formed for a long length of 2.5 mm, because of its low resistance it is very suitable for bus lines to propagate signals within a chip, and a high speed operation of 10 MHz or more can be satisfactorily made. And in the vertical direction, polycrystalline wirings 61 to 68 are used only for interblock connection, and for vertical wiring inside each cell, aluminum wiring can be used. Accordingly, for instance even when such a long signal line in the vertical direction of 1.6 mm extending from the logic circuit block I to the logic circuit block VIII is used, 1.2 mm of it is formed with aluminum wiring and only 0.4 mm parts are of polycrystalline silicon wirings. Accordingly, even though the polycrystalline silicon wirings has ¼ propagation speed of the aluminum wirings, the actual vertical signal propagation in this microcomputer is not substantially delayed by the polycrystalline silicon wiring part.

In case of a 16-bit microcomputer the vertical accumulation of the logic circuit blocks becomes 16 stages, but even for such large integrated device, the vertical propagation is also satisfactory, and the technical advantage of the present invention is very helpful in improving the characteristic of the microcomputer or the like LSI.

What is claimed is:

1. A complementary MOS I formed on a single semiconductor substrate comprising:
    a logic cell including a p-type MOS elements region and an n-type MOS elements regions which are faced to each other and disposed in a first direction, a plurality of said logic cells forming a logic circuit block and said p-type MOS elements regions of said logic cells being disposed proximate to each other and said n-type MOS elements regions of said logic cells being disposed prodximate to each other;
    a first metal wiring extending in said first direction for interconnection between said p-type MOS elements region and said n-type MOS elements region, thereby to make said logic cell operate as a desired logic gate or a feed-through wiring which passes through said logic circuit block;
    a second metal wiring extending in a second direction which is perpendicular to said first direction, along outer edges of said p-type MOS elements region and said n-type MOS elements region, and serving as wiring for power source potential and ground potential;
    said logic circuit block being formed in a manner that said logic cells are arranged in said second direction, and being disposed in said first direction;
    a third metal wiring extending in said second direction at a space between two neighboring logic circuit blocks;
    a polycrystalline silicon wiring disposed in said first direction crossing under said second metal wiring and insulated from said semiconductor substrate and from said second metal wiring, and led out in said first direction from said logic cell,
    said logic cells being coupled to each other by use of said polycrystalline silicon wiring and at least one of said first metal wiring and said third metal wiring;
    a diffused region disposed in said second direction along an inner edge of said each MOS elements region, said inner edge being neighboring with the other type MOS elements region in the same logic cell, for serving as electric wiring for power source potential or ground potential; and
    a fourth metal wiring disposed in said first direction for connecting said diffused region and said second metal wiring.

2. A complementary MOS IC formed on a single semiconductor substrate comprising:
    a logic cell including a p-type MOS elements region and an n-type MOS elements region which are faced to each other and disposed in a first direction, a plurality of said logic cells forming a logic circuit block and said p-type MOS elements regions of said logic cells being disposed proximate to each other and said n-type MOS elements regions of said logic cells being disposed proximate to each other;
    a first metal wiring extending in said first direction for interconnection between said p-type MOS elements region and said n-type MOS elements region, thereby to make said logic cell operate as a desired logic gate or a feed-through wiring which passes through said logic circuit block;
    a second metal wiring extending in a second direction which is perpendicular to said first direction, along outer edges of said p-type MOS elements region and said n-type MOS elements region, and serving as wiring for power source potential and ground potential;
    said logic circuit block being formed in a manner that said logic cells are arranged in said second direction, and being disposed in said first direction;
    a third metal wiring extending in said second direction at a space between two neighboring logic circuit blocks;
    a polycrystalline silicon wiring disposed in said first direction crossing under said second metal wiring and insulated from said semiconductor substrate and from said second metal wiring, and led out in said first direction from said logic cell;
    said logic cells being coupled to each other by use of said polycrystalline silicon wiring and at least one of said first metal wiring and said third metal wiring;
    a second polycrystalline silicon wiring having same kind of material as gate material and disposed on a field oxide between said p-type MOS elements region and said n-type MOS elements region, for connecting said logic cells belonging to said same logic circuit block, being led out in said second direction from said logic cell;
    a diffused region disposed in said second direction along an inner edge of said each MOS elements region, said inner edge being neighboring with the other type MOS elements region in the same logic cell, for serving as electric wiring for power source potential or ground potential, and a fourth metal wiring disposed in said first direction for connecting said diffused region and said second metal wiring.

3. A complementary MOS IC in accordance with claim 2, wherein
said metal wiring is aluminum wiring.

4. A complementary MOS IC in accordance with claim 2, wherein in neighboring two of said logic circuit blocks, MOS complementary element regions of the same conductivity types are disposed to neighbor each other.

5. A complementary MOS IC in accordance with claim 4, which further comprises guard bands encircling said regions of one conductivity type.

6. A complementary MOS IC in accordance with claim 1, wherein
said metal wiring is aluminum wiring.

7. A complementary MOS IC in accordance with claim 1, wherein in neighboring two of said logic circuit blocks, MOS complementary element regions of the same conductivity types are disposed to neighbor each other.

8. A complementary MOS IC in accordance with claim 7, which further comprises guard bands encircling said regions of one conductivity type.

* * * * *